US008305321B2

(12) United States Patent
Park et al.

(10) Patent No.: US 8,305,321 B2
(45) Date of Patent: Nov. 6, 2012

(54) APPARATUS FOR DRIVING SOURCE LINES AND DISPLAY APPARATUS HAVING THE SAME

(75) Inventors: Moon-Chul Park, Seoul (KR); Yeong-Koo Kim, Seoul (KR); Hisashi Kimura, Suwon-si (KR); Chang-Jin Im, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1289 days.

(21) Appl. No.: 12/038,638

(22) Filed: Feb. 27, 2008

(65) Prior Publication Data

US 2008/0204086 A1 Aug. 28, 2008

(30) Foreign Application Priority Data

Feb. 27, 2007 (KR) ........................ 10-2007-0019321

(51) Int. Cl.
*H03K 3/00* (2006.01)

(52) U.S. Cl. ........................... 345/98; 345/204; 327/108

(58) Field of Classification Search .................. 345/204, 345/87
See application file for complete search history.

(56) References Cited

U.S. PATENT DOCUMENTS 7,292,217 B2 * 11/2007 Tseng et al. .................. 345/100
7,382,168 B2 * 6/2008 Bhattacharya et al. ........ 327/112
7,852,303 B2 * 12/2010 Hashimoto ..................... 345/98
8,094,113 B2 * 1/2012 Yokota et al. ................... 345/98
2004/0178981 A1 * 9/2004 Asada et al. ..................... 345/96
2004/0263466 A1 * 12/2004 Song et al. .................... 345/100

FOREIGN PATENT DOCUMENTS

JP 2004-093691 3/2004
KR 10-2004-0006927 1/2004
KR 10-2004-0093877 11/2004

OTHER PUBLICATIONS

English Patent Publication No. 1020040093877.
English Patent Publication No. 2004-093691.
English Patent Publication No. 1020040006927.

* cited by examiner

*Primary Examiner* — Grant Sitta
(74) *Attorney, Agent, or Firm* — F. Chau & Associates, LLC

(57) ABSTRACT

An apparatus for driving source lines includes an output buffer, a first switch and a second switch. The output buffer outputs a first voltage and a second voltage having an opposite phase to the first voltage during an output interval including a first interval portion and a second interval portion. The first switch applies the first and second voltages to an m-th source line and an (m+1)-th source line respectively during the first interval portion and blocks the first and second voltages during the second interval portion. The second switch includes a plurality of switching elements, the second switch short-circuiting the m-th source line and the (m+1)-th source line during the second interval portion, wherein the m-th source line has at least two connecting portions to be electrically connected to the (m+1)-th source line.

20 Claims, 8 Drawing Sheets

APPARATUS FOR DRIVING SOURCE LINES AND DISPLAY APPARATUS HAVING THE SAME

CROSS-REFERENCE TO RELATED APPLICATIONS

This application claims priority under 35 U.S.C. §119 to Korean Patent Application No. 2007-19321, filed on Feb. 27, 2007, in the Korean Intellectual Property Office (KIPO), the contents of which are herein incorporated by reference in their entirety.

BACKGROUND OF THE INVENTION

1. Field of the Invention

The present invention relates to an apparatus for driving source lines and a display apparatus having the apparatus for driving source lines. More particularly, the present invention relates to an apparatus for driving source lines used for a display apparatus and a display apparatus having the apparatus for driving source lines capable of improving image display quality.

2. Description of Related Art

A display apparatus includes a liquid crystal capacitor. The liquid crystal capacitor includes a pixel electrode, a common electrode opposite the pixel electrode and a liquid crystal layer interposed between the pixel electrode and the common electrode. A data voltage applied to the pixel electrode generates an electric field. The electric field changes an arrangement of liquid crystal molecules of the liquid crystal layer so that an amount of light passing through the liquid crystal layer is controlled. The brightness of the light passing through the liquid crystal layer changes the gray scales of an image. When the electric field remains uniform for a predetermined time, the liquid crystal layer may deteriorate.

To substantially prevent the liquid crystal layer from deteriorating, polarities of the data voltage applied to the pixel electrode are periodically inverted. Methods that periodically invert the polarities of the voltage applied to the pixel electrode include a dot inversion method that inverts the polarities of the voltage by dot or pixel.

An apparatus for driving source lines employing the dot inversion method repeatedly outputs a positive voltage and a negative voltage which are inverted in relation to each other. The data voltage outputted from the apparatus for driving source lines should have voltage difference of 2 V. When a voltage output from the apparatus for driving source lines is not sufficient, the charging amount of the pixels may be insufficient.

SUMMARY OF THE INVENTION

An apparatus for driving source lines according to an exemplary embodiment of the present invention includes an output buffer, a first switch and a second switch. The output buffer outputs a first voltage and a second voltage during an output interval. The second voltage has an opposite phase to the first voltage. The output interval includes a first interval portion and a second interval portion. The first switch applies the first voltage and the second voltage to an m-th source line and an (m+1)-th source line respectively during the first interval portion and blocks the first voltage and the second voltage during the second interval portion. The second switch includes a plurality of switching elements, the second switch short-circuiting the m-th source line and the (m+1)-th source line during the second interval portion, wherein the m-th source line has at least two connecting portions to be electrically connected to the (m+1)-th source line.

A display apparatus according to exemplary embodiment of the present invention includes a display panel and an apparatus for driving source lines. The display panel includes a plurality of gate lines, a plurality of source lines and a plurality of pixels connected to the gate lines and the source lines. The apparatus for driving source lines includes an output buffer, a first switch and a second switch. The output buffer outputs a first voltage and a second voltage having an opposite phase to the first voltage during an output interval. The output interval has a first interval portion and a second interval portion. The first switch applies the first voltage and the second voltage to an m-th source line and an (m+1)-th source line respectively during the first interval portion and blocks the first voltage and the second voltage during the second interval portion. The second switch includes a plurality of switching element, the second switch short-circuiting the m-th source line and the (m+1)-th source line during the second interval portion, wherein the m-th source line has at least two connecting portions to be electrically connected to the (m+1)-th source line.

BRIEF DESCRIPTION OF THE DRAWINGS

The present invention will become more apparent by describing in detailed example embodiments thereof with reference to the accompanying drawings, in which.

DETAILED DESCRIPTION OF EXEMPLARY EMBODIMENTS

Figure 1:
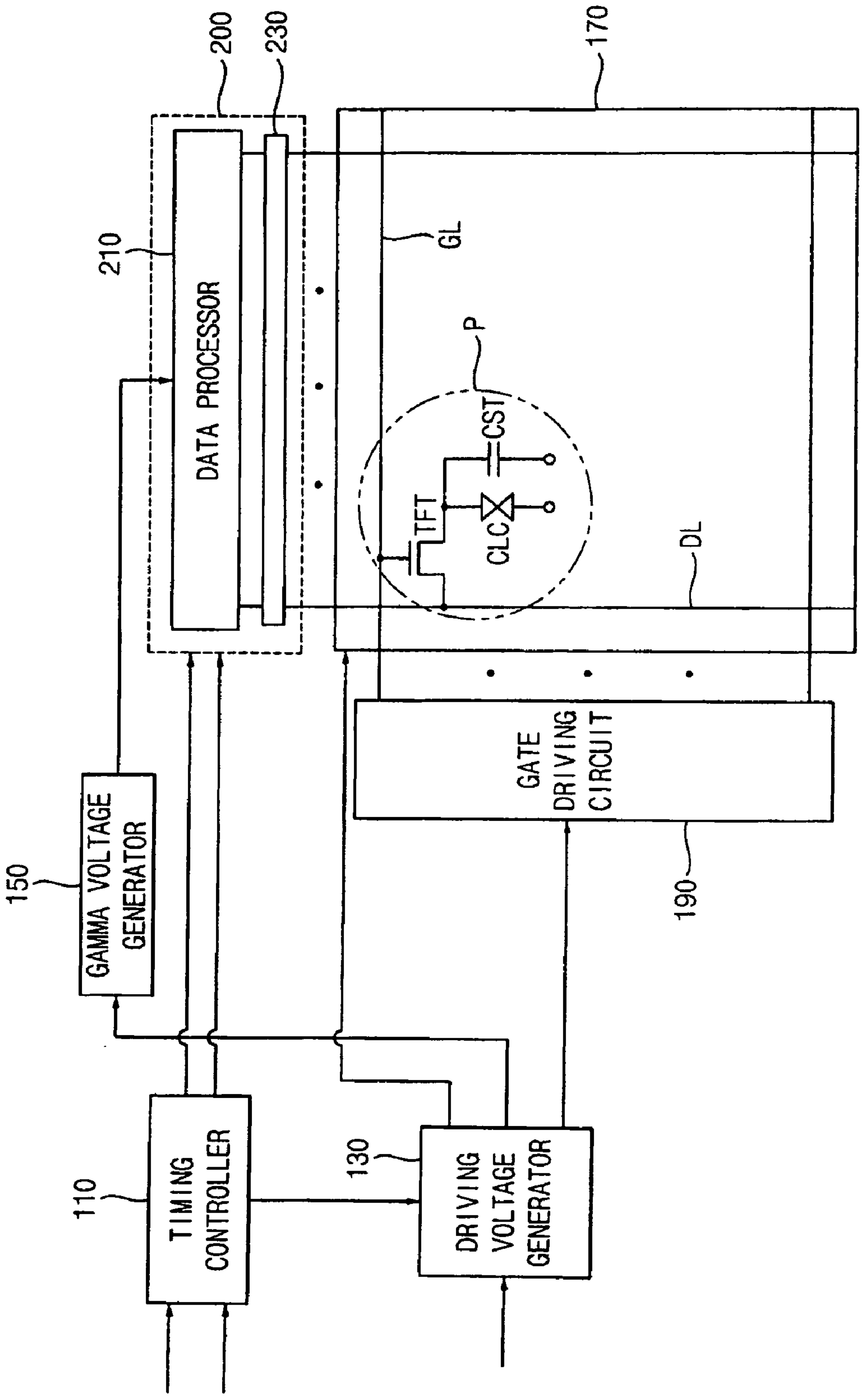
FIG. 1 is a block diagram illustrating a display apparatus according to an exemplary embodiment of the present invention.

The invention is described more fully hereinafter with reference to the accompanying drawings, in which embodiments of the invention are shown. This invention may, however, be embodied in many different forms and should not be construed as limited to embodiments set forth herein. Rather, embodiments are provided so that this disclosure will be thorough and complete, and will fully convey the scope of the invention to those skilled in the art. In the drawings, the size and relative sizes of layers and regions may be exaggerated for clarity.

Hereinafter, the present invention will be explained in detail with reference to the accompanying drawings.

Figure 2:
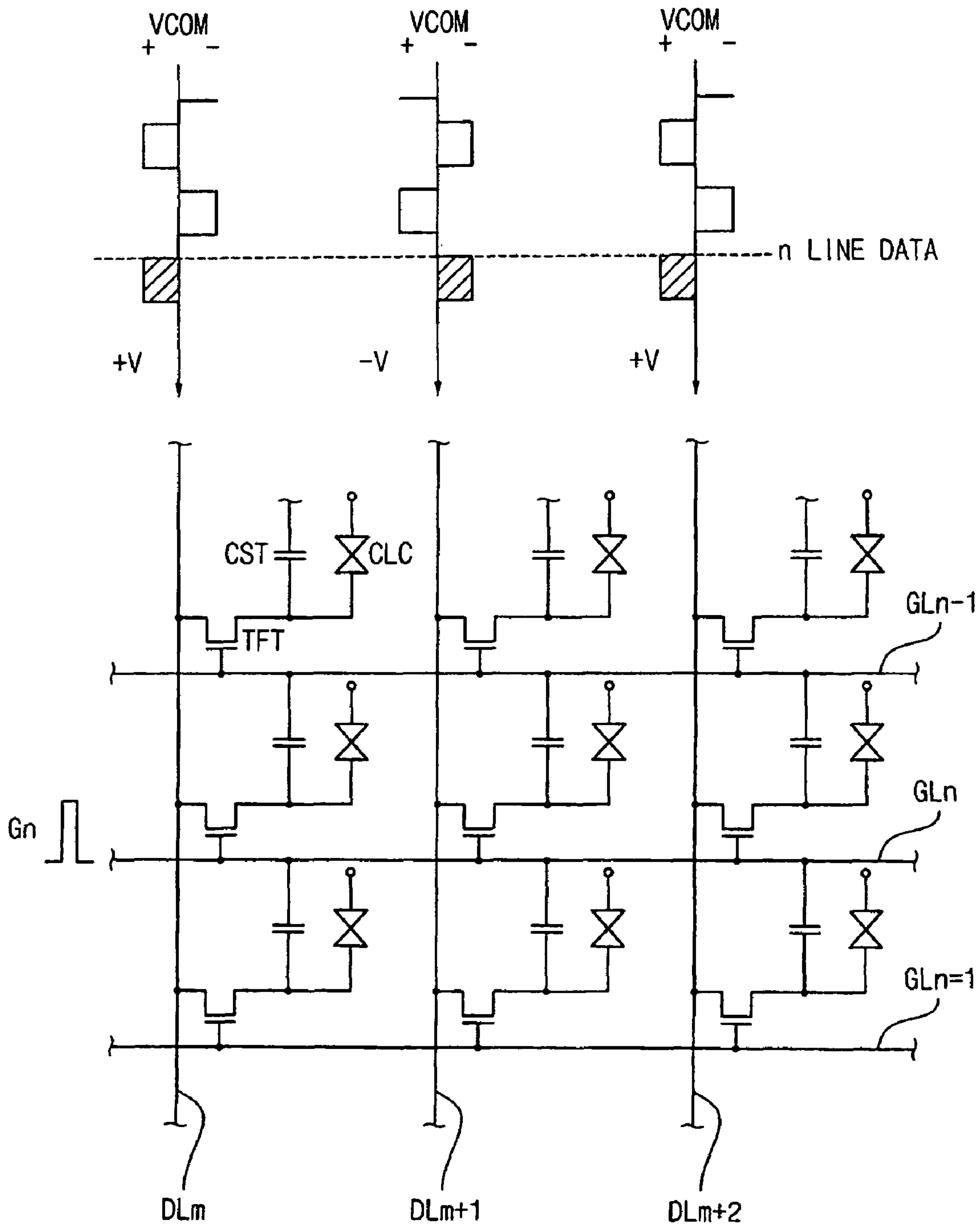
FIG. 2 is a schematic circuit diagram illustrating the operation of the display panel shown in FIG. 1.

FIG. 1 is a block diagram illustrating a display apparatus according to an exemplary embodiment of the present invention. FIG. 2 is a schematic circuit diagram illustrating the operation of the display panel shown in FIG. 1.

Referring to FIGS. 1 and 2, a display apparatus includes a timing controller 110, a driving voltage generator 130, a gamma voltage generator 150, a display panel 170, an apparatus for driving gate lines 190, and an apparatus for driving source lines 200.

The timing controller 110 controls the driving voltage generator 130, the gamma voltage generator 150, the display panel 170, the apparatus for driving gate lines 190, and the apparatus for driving source lines 200 in response to a data signal provided from an external graphic controller (not shown), a vertical synchronizing signal VSYNC, a horizontal synchronizing signal HSYNC, and a main clock signal MCLK. The vertical synchronizing signal VSYNC distinguishes between frames, and the horizontal synchronizing signal HSYNC distinguishes between lines.

The driving voltage generator 130 generates a driving voltage for driving the display apparatus based on an external power supply. The driving voltage includes a power voltage applied to the gamma voltage generator 150, a common voltage (VCOM) applied to the display panel 170, and gate voltages (VON and VOFF) applied to the apparatus for driving gate lines 190.

The gamma voltage generator 150 generates reference gamma voltages VGAM based on a gamma curve.

The display panel 170 includes gate lines GL, source lines DL, and a plurality of pixels P. Each of the pixels P includes a switching element TFT, a liquid crystal capacitor CLC, and a storage capacitor CST. The switching element TFT is connected to the gate line GL and the source line DL. The liquid crystal capacitor CLC and the storage capacitor CST are connected to the switching element TFT. The liquid crystal capacitor CLC includes a first end connected to the switching element TFT to receive a data voltage applied to the source line, and a second end receiving the common voltage VCOM provided from the driving voltage generator 120.

The display panel 170 includes a display area including the pixels P and a peripheral area (not shown) surrounding the display area. The apparatus for driving gate lines 190 is disposed adjacent to ends of the gate lines GL and the apparatus for driving source lines 200 is disposed adjacent to ends of the source lines DL. For example, the apparatus for driving gate lines 190 may be disposed in the peripheral area.

The apparatus for driving gate lines 190 generates gate signals by using a gate control signal provided from the timing controller 110 and the gate voltages VON and VOFF provided from the driving voltage generator 130. The apparatus for driving gate lines 190 sequentially outputs the gate signals to the gate lines GL.

The apparatus for driving source lines 200 includes a data processor 210 and a charge divider 230.

The data processor 210 converts the data signal provided from the timing controller 210 into an analog data signal. The data voltage outputted from the data processor 210 is applied to adjacent source lines DL in the forms of a positive data voltage +V and a negative data voltage −V respectively having opposite phases to each other with respect to the common voltage VCOM. In addition, the data processor 210 inverts the data voltage for every horizontal line and outputs the inverted data voltage.

For example, data voltages of an n-th horizontal line includes the positive data voltage +V applied to an m-th source line DLm, the negative data voltage −V applied to an (m+1)-th source line Dm+1, and the positive data voltage +V applied to an (m+2)-th source line DLm+2. Data voltages of an (n+1)-th horizontal line include the negative data voltage −V applied to the m-th source line DLm, the positive data voltage +V applied to the (m+1)-th source line Dm+1, and the negative data voltage −V applied to the (m+2)-th source line DLm+2, which respectively have opposite phases to the data voltages of the n-th horizontal line.

The charge divider 230 causes short-circuits between the m-th source line DLm and the (m+1)-th source line DLm+1 during a predetermined interval of an output interval for which the data voltages are outputted from the data processor 210. When the short circuit between the m-th source line DLm and the (m+1)-th source line DLm+1 is caused, the positive data voltage +V applied to the m-th source line DLm is added to the negative data voltage −V applied to the (m+1)-th source line DLm+1 to generate a charge dividing voltage CSV (shown in FIG. 4). The charge dividing voltage CSV is applied to the m-th source line DLm and the (m+1)-th source line DLm+1. The charge dividing voltage CSV may be substantially the same as the common voltage VCOM.

The output interval includes a first interval portion OI1 and a second interval portion OI2. The positive data voltage or the negative data voltage is applied to a pixel P during the first interval portion OI1. The charge dividing voltage CSV is applied to the pixel P during the second interval portion OI2. Since the pixel is pre-charged by the charge dividing voltage CSV, a charging rate of the pixel P may be improved.

Figure 3:
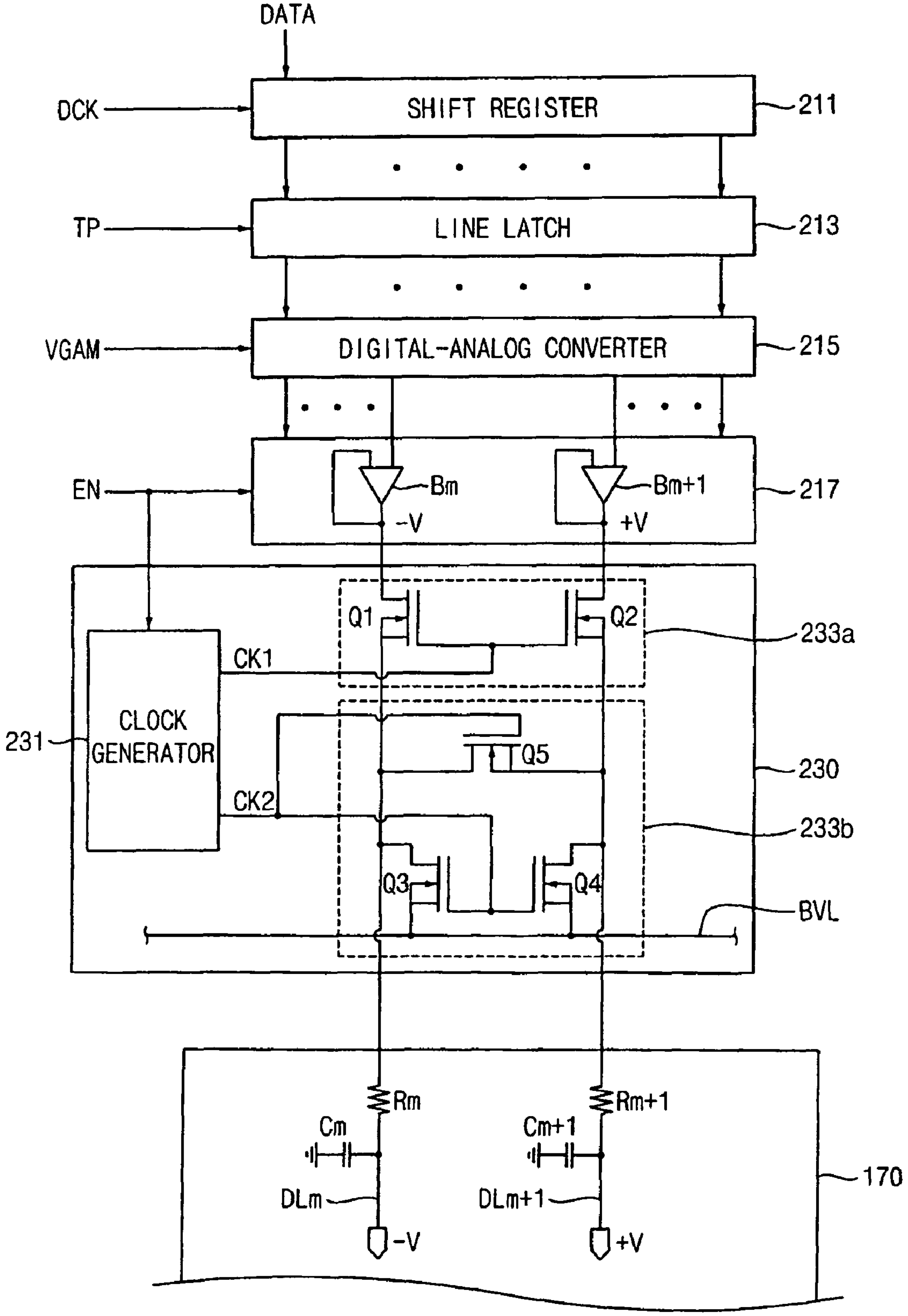
FIG. 3 is a block diagram illustrating the apparatus for driving source lines shown in FIG. 1.
Figure 4:
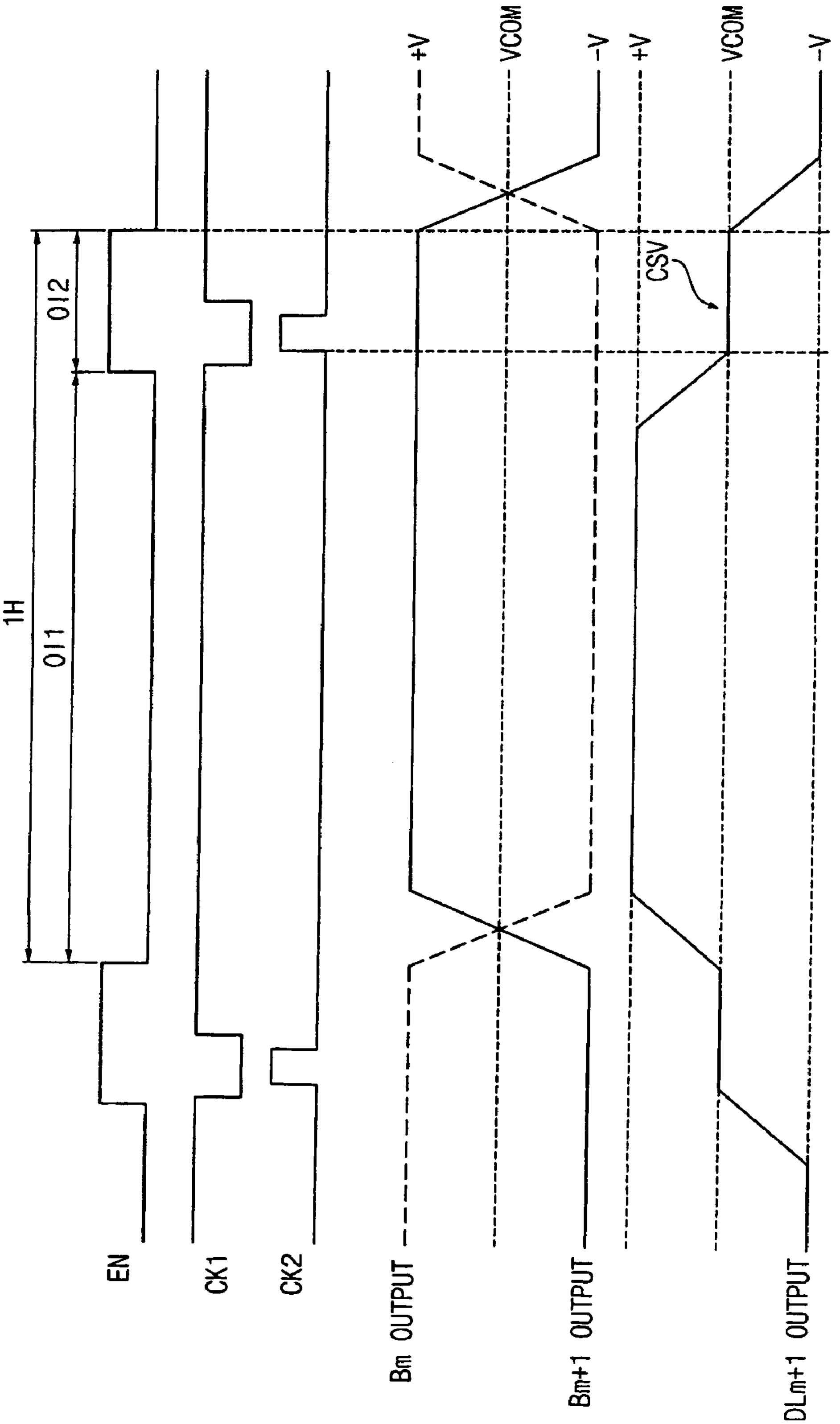
FIG. 4 is a timing diagram illustrating input signals or output signals of the apparatus for driving source lines shown in FIG. 1.

FIG. 3 is a block diagram illustrating an apparatus for driving source lines 200 shown in FIG. 1. FIG. 4 is a timing diagram illustrating input signals and output signals of the apparatus for driving source lines 200 shown in FIG. 1.

Referring to FIGS. 1, 3 and 4, the apparatus for driving source lines 200 includes the data processor 210 and the charge divider 230. The data processor 210 depicted in FIG. 3 includes a shift register 211, a line latch 213, a digital-to-analog converter (DAC) 215, and an output buffer 217.

The shift register 211 outputs the inputted data signals DATA on the basis of a horizontal start signal (STH) and a dot clock signal (DCK) as data signals having a dot unit. The line latch 213 latches the data signals having a dot unit by line unit and outputs data signals having the line unit on the basis of a load signal (TP) provided from the timing controller 110.

The DAC 215 converts the data signals having the line unit into analog data voltages by using the reference gamma voltage VGAM. The DAC 215 inverts polarities of adjacent data voltages with respect to the common voltage VCOM on the basis of an inverse signal INV of a dot reverse type provided from the timing controller 110.

The output buffer 217 includes buffers Bm and Bm+1 buffering the data voltages having the line unit. The output buffer 217 outputs the data voltage having the line unit into the source lines on the basis of an enable signal EN provided from the timing controller 110. The enable signal EN corresponds to a horizontal interval (1H), and includes the first interval portion OI1 and the second interval portion OI2.

The charge divider 230 includes a clock generator 231, a first switch 233*a*, and a second switch 233*b*. The clock generator 231 generates a first clock signal CK1 and a second clock signal CK2 on the basis of the enable signal EN.

The first clock signal CK1 has a low pulse during a portion of the second interval portion OI2 of the enable signal EN. The second clock signal CK2, synchronized by the first clock signal CK1, has a high pulse during a portion of the low pulse of the first clock signal CK1.

The first switch 233*a* is operated in response to the first clock signal CK1, and the second switch 233*b* is operated in response to the second clock signal CK2.

The first switch 233*a* includes a first switching element Q1 and a second switching element Q2. The first switching element Q1 is connected to an output terminal of the m-th buffer Bm of the output buffer 217. Hereinafter, the output terminal of the m-th buffer will be referred to as an m-th output terminal. The second switching element Q2 is connected to an output terminal of the (m+1)-th buffer Bm+1 of the output buffer 217. Hereinafter, the output terminal of the (m+1)-th buffer will be referred to as an (m+1)-th output terminal. The first switching element Q1 includes a control electrode receiving the first clock signal CK1, a first current electrode connected to the m-th output terminal Bm and a second current electrode connected to the m-th source line DLm. The second switching element Q2 includes a control electrode receiving the first clock signal CK1, a third current electrode connected to the (m+1)-th output terminal Bm+1 and a fourth current electrode connected to the (m+1)-th source line DLm+1.

When a high signal is applied to the control electrode of the first switching element Q1 and the control electrode of the second switching element Q2 during the first interval portion OI1, the first and second switching elements Q1 and Q2 are turned on so that the negative data voltage (−V) outputted from the m-th output terminal Bm and the positive data voltage (+V) outputted from the (m+1)-output terminal Bm+1 are respectively outputted into the m-th source line DLm and the (m+1)-th source line DLm+1 of the display panel 170.

When a low signal is applied to the control electrode of the first switching element Q1 and the control electrode of the second switching element Q2 during the second interval portion OI2, the first and second switching elements Q1 and Q2 are turned off so that the negative data voltage (−V) and the positive data voltage (+V) are blocked from the m-th source line DLm and the (m+1)-th source line DLm+1, respectively. Therefore, the data voltages are not applied to the m-th source line DLm and the (m+1)-th source line DLm+1 during the second interval portion OI12.

The second switch 233*b* includes a third switching element Q3, a fourth switching element Q4 and a fifth switching element Q5. The third switching element Q3 is connected to the m-th source line DLm. The fourth switching element Q4 is connected to the (m+1)-th source line DLm+1. The third and fourth switching elements Q3 and Q4 are connected to each other. The fifth switching element Q5 is connected in parallel to the third and fourth switching elements Q3 and Q4.

The third switching element Q3 includes a control electrode receiving the second clock signal CK2, a first current electrode connected to the m-th source line DLm and a current electrode connected to a bias voltage line BVL. The fourth switching element Q4 includes a control electrode receiving the second clock signal CK2, a third current electrode connected to the (m+1)-th source line DLm+1 and a fourth current electrode connected to the bias voltage line BVL. The fifth switching element Q5 includes a control electrode receiving the second clock signal CK2, a fifth current electrode connected to the m-th source line DLm and a sixth current electrode connected to the (m+1)-th source line DLm+1.

When the third switching element Q3, the fourth switching element Q4 and the fifth switching element Q5 are turned off during the first interval portion OI1, the m-th source line DLm and the (m+1)-th source line DLm+1 are electrically opened to respectively receive the negative data voltage −V and the positive data voltage +V.

When the third switching element Q3, the fourth switching element Q4 and the fifth switching element Q5 are turned on during the second interval portion OI2, the m-th source line DLm and the (m+1)-th source line DLm+1 are short-circuited so that the charge dividing voltage CSV corresponding to the negative data voltage −V and the positive data voltage +V respectively applied to the m-th source line DLm and the (m+1)-th source line DLm+1 is applied to the m-th source line DLm and the (m+1)-th source line DLm+1.

Accordingly, the (m+1)-th source line DLm+1 receives the positive data voltage +V during the first interval portion OI1 of the horizontal interval 1H and the charge dividing voltage CSV during the second interval portion OI2 of the horizontal interval 1H.

According to an exemplary embodiment of the present invention, the apparatus for driving source lines 200 is a chip-type integrated circuit (IC), and includes the first and second switches 233*a* and 233*b* formed therein. Each of the first, second, third, fourth, and fifth switching elements Q1, Q2, Q3, Q4, and Q5 may be a field-effect transistor (FET). The first, second, third, fourth, and fifth switching elements Q1, Q2, Q3, Q4, and Q5 may be changed when the IC design is changed. The first, second, third, fourth, and fifth switching elements Q1, Q2, Q3, Q4, and Q5 may be switched at nanosecond (ns) speeds.

Hereinafter, substantially the same components are referred to by the same reference numerals and any repetitive explanation will be omitted.

Figure 5:
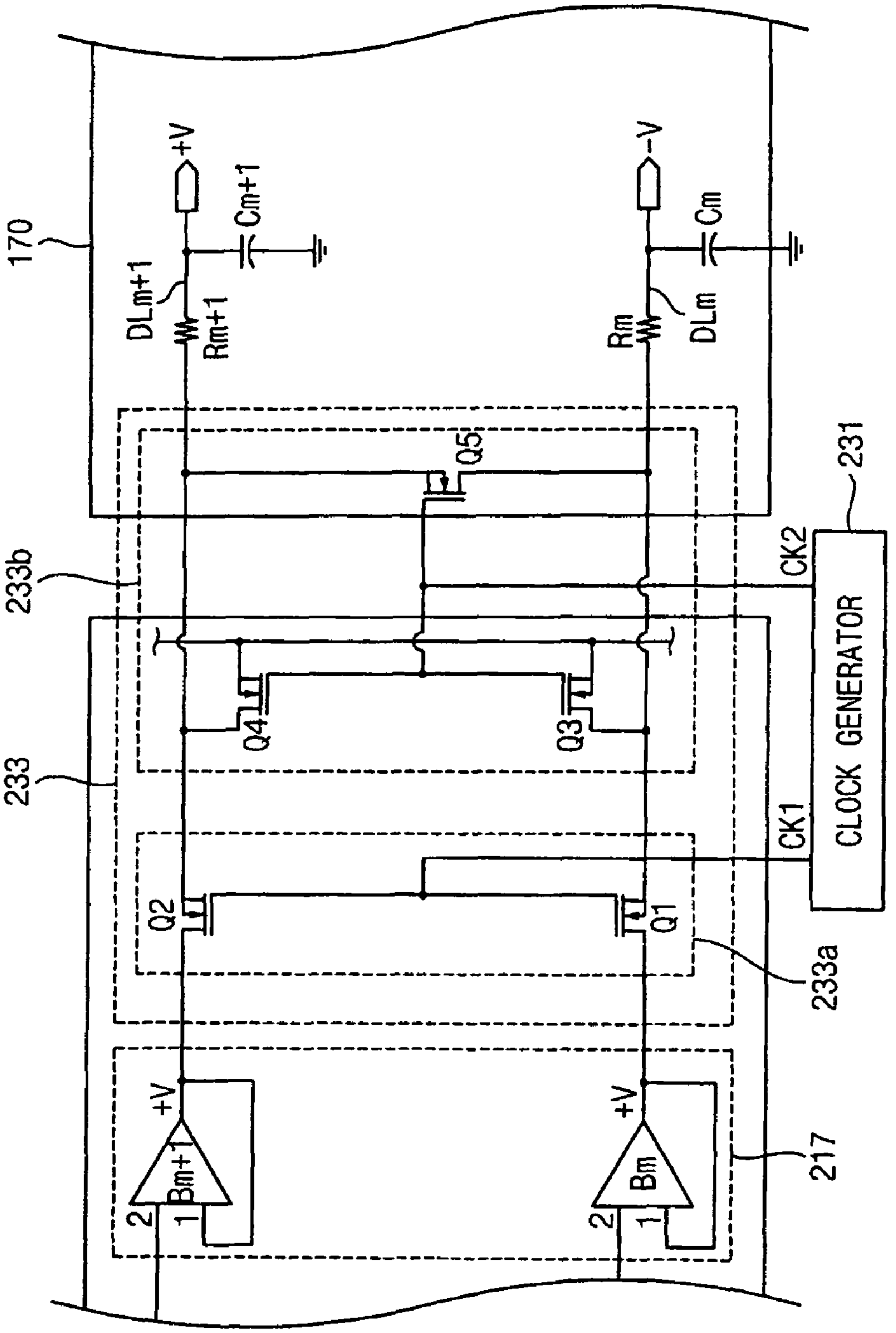
FIG. 5 is a block diagram illustrating a apparatus for driving source lines according to an exemplary embodiment of the present invention.

FIG. 5 is a block diagram illustrating an apparatus for driving source lines according to an exemplary embodiment of the present invention.

Referring to FIGS. 4 and 5, an apparatus for driving source lines according to an exemplary embodiment of the present invention includes a fifth switching element Q5 integrated on a peripheral area of the display panel 170. Remaining components, except for the fifth switching element Q5 and operation of the apparatus for driving source lines, are substantially the same as the apparatus for driving source lines shown in FIGS. 3 and 4.

For example, the apparatus for driving source lines 200 includes the data processor (not shown) and the charge divider 230. The data processor includes the shift register 211, the line latch 213, the DAC 215, and the output buffer 217. The charge divider 230 includes the clock generator 231, the first switch 233*a* and the second switch 233*b*.

The first switch 233*a* includes the first switching element Q1 connected to the m-th output terminal Bm of the output buffer 217 and the second switching element Q2 connected to the (m+1)-th output terminal Bm+1 of the output buffer 217.

The second switch 233*b* includes the third switching element Q3, the fourth switching element Q4 and the fifth switching element Q5. The third switching element Q3 is connected to the m-th source line DLm. The fourth switching element Q4 is connected to the (m+1)-th source line DLm+1. The third and fourth switching elements Q3 and Q4 are connected to each other in series.

The fifth switching element Q5 is connected in parallel to the third and fourth switching elements Q3 and Q4. The fifth switching element Q5 is integrated on the peripheral area of the display panel 170. The fifth switching element Q5 may include a transistor having a channel layer formed using polycrystalline silicon.

Figure 6A:
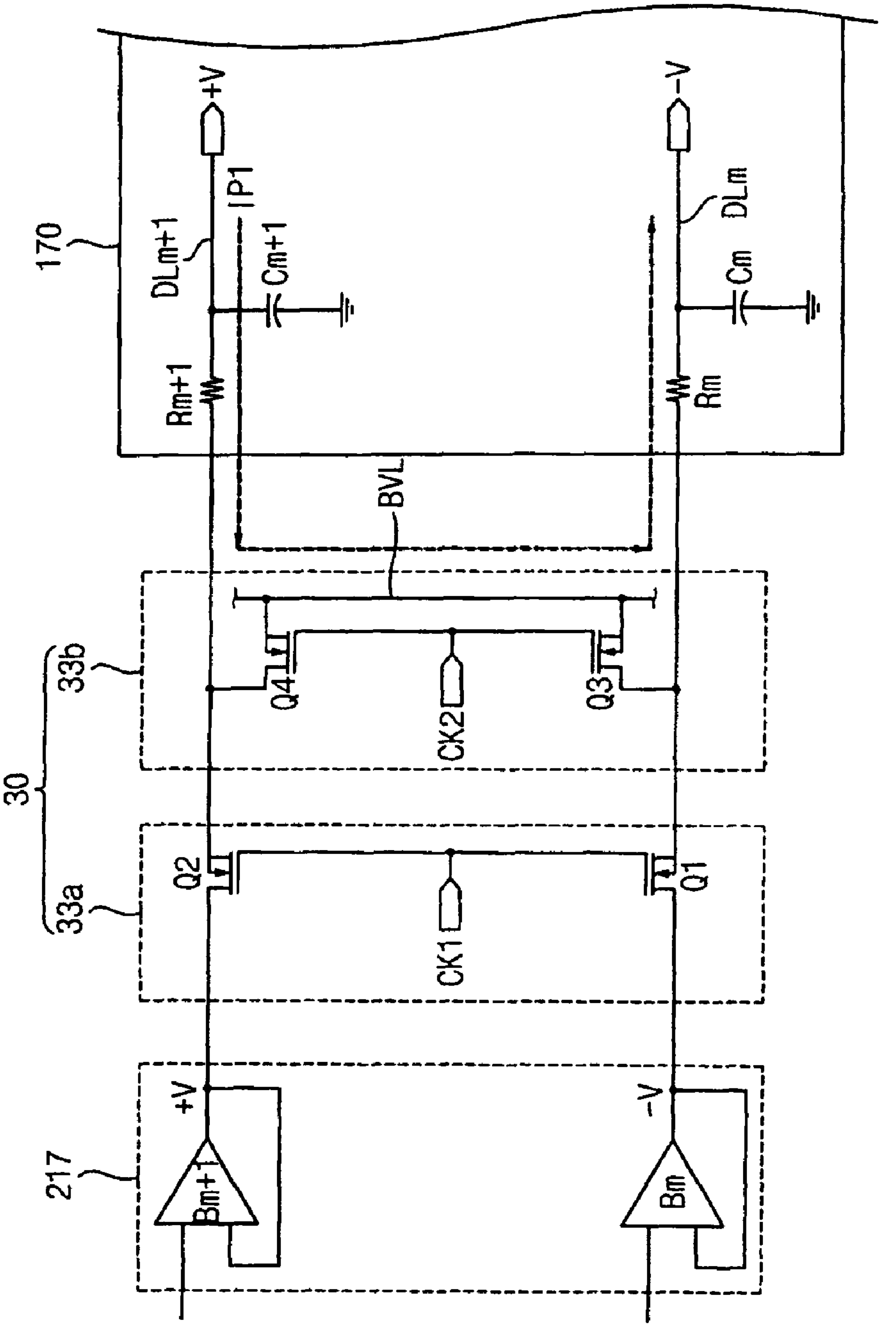
FIG. 6A is a circuit diagram illustrating a charge divider according to an exemplary embodiment.
Figure 6B:
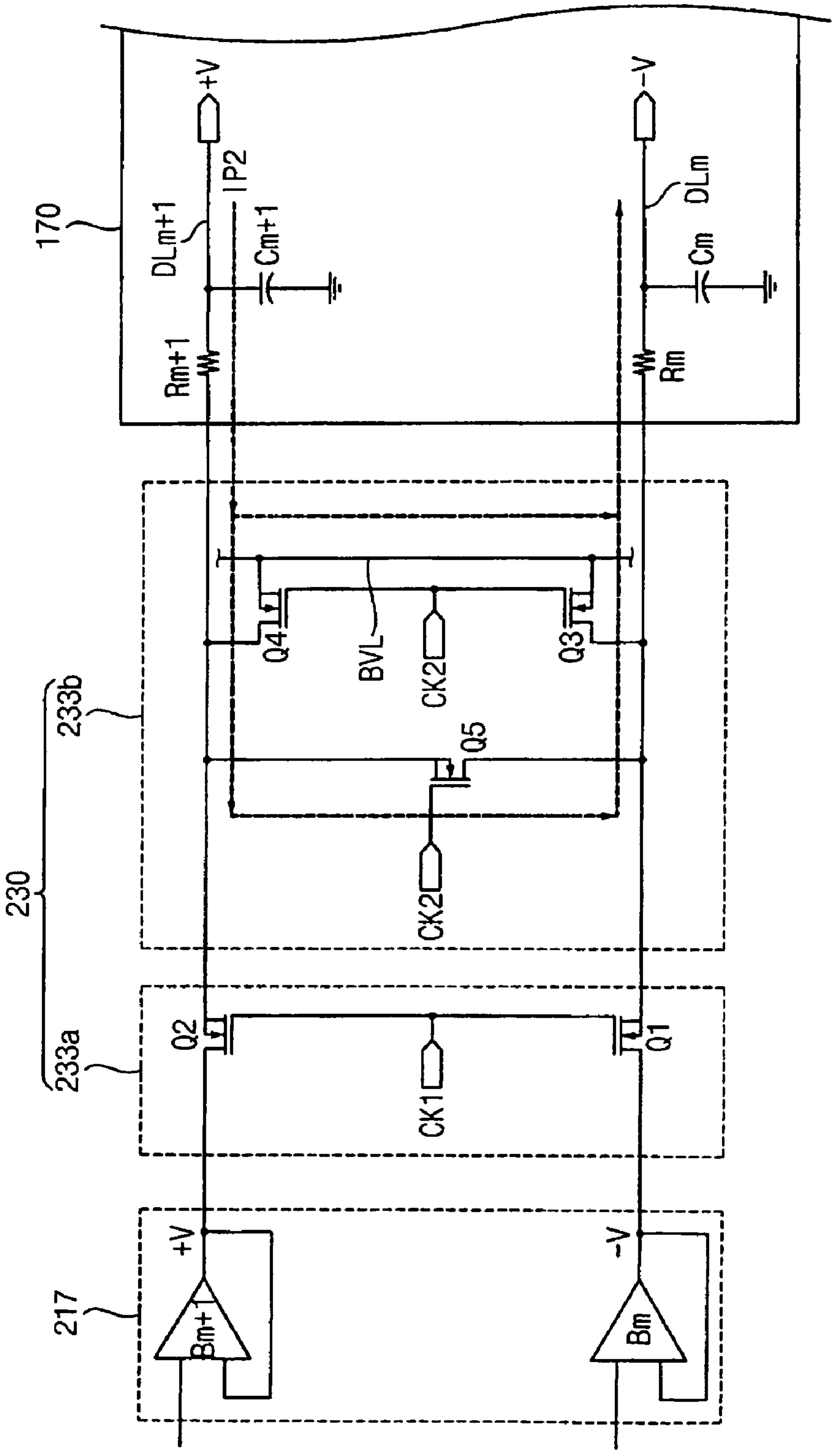
FIG. 6B is a circuit diagram illustrating a charge divider according to an exemplary example embodiment of the present invention.

FIG. 6A is a circuit diagram illustrating a charge divider according to an exemplary embodiment of the present invention. FIG. 6B is a circuit diagram illustrating a charge divider according to another exemplary embodiment of the present invention.

Referring to FIG. 6A, a charge divider 30 includes a first switch 33*a* and a second switch 33*b*. The first switch 33*a* includes a first switching element Q1 and a second switching element Q2. The first switching element Q1 is connected to the m-th output terminal Bm of the output buffer 217. The second switching element Q2 is connected to the (m+1)-th output terminal Bm+1. The second switch 33*b* includes a third switching element Q3 and a fourth switching element Q4. The third switching element Q3 is connected to the m-th source line DLm. The fourth switching element Q4 is connected to the (m+1)-th source line DLm+1.

During the first interval portion OI1, the first switch 33*a* is turned on and the second switch 33*b* is turned off. Therefore, the negative data voltage −V and the positive data voltage +V respectively outputted from the m-th output terminal Bm and the (m+1)-th output terminal Bm+1 are respectively outputted into the m-th source line DLm and the (m+1)-th source line DLm+1.

During the second interval portion OI2, the first switch 33*a* is turned off and the second switch 33*b* is turned on. Therefore, the negative data voltage −V outputted from the m-th output terminal Bm and the positive data voltage +V outputted from the (m+1)-th output terminal Bm+1 are blocked, and the m-th source line DLm and the (m+1)-th source line DLm+1 are short-circuited to each other. Accordingly, a first current path IP1 is formed as shown in FIG. 6A.

The first current path IP1 is sequentially formed by the m-th source line DLm, the third switching element Q3, the fourth switching element Q4 and the (m+1)-th source line DLm+1. The positive data voltage (+V) has been applied the m-th source line DLm and the negative data voltage (−V) has been applied to the (m+1)-th source line DLm+1.

A first power consumption level (Ptotal1) consumed through the first current path IP1 may be represented as Equation 1.

$$Ptotal1=\{P[DLm]+P[DLm+1]\}+\{P[Q3]+P[Q4]\} \quad \text{[Equation 1]}$$

$$\text{wherein } P[Q3]+P[Q4]=(Itotal)^2\times 2R_Q.$$

P[DLm], P[DLm+1], P[Q3], and P[Q4] respectively represent a power consumption level of the m-th source line DLm, a power consumption level of the (m+1)-th source line DLm+1, a power consumption level of the third switching element Q3, and a power consumption level of the fourth switching element Q4. Itotal represents a current flowing through the first current path IP1, and $2R_Q$ represents an internal resistance of the third and fourth switching elements Q3 and Q4.

Referring to FIG. 6B, the charge divider 230 includes the first switch 233*a* and the second switch 233*b*. The first switch 233*a* includes the first switching element Q1 and the second switching element Q2. The first switching element Q1 is connected to the m-th output terminal Bm of the output buffer 217. The second switching element Q2 is connected to the (m+1)-th output terminal Bm+1 of the output buffer 217. The second switch 233*b* includes the third switching element Q3, the fourth switching element Q4 and the fifth switching element Q5. The third and fourth switching elements Q3 and Q4 are connected to each other. The fifth switching element Q5 is connected in parallel to the third and fourth switching elements Q3 and Q4. The third switching element Q3 is connected to the m-th source line DLm and the fourth switching element Q4 is connected to the (m+1)-th source line DLm+1.

During the first interval portion OI1, the first switch 233*a* is turned on and the second switch 233*b* is turned off. Therefore, the negative data voltage −V outputted from the m-th output terminal Bm and the positive data voltage +V outputted from the (m+1)-th output terminal Bm+1 are respectively outputted to the m-th source line DLm and the (m+1)-th source line DLm+1.

During the second interval portion OI2, the first switch 233*a* is turned off and the second switch 233*b* is turned on. Therefore, the negative data voltage −V outputted from the m-th output terminal Bm and the positive data voltage +V outputted from the (m+1)-th output terminal Bm+1 are blocked and the m-th source line DLm and the (m+1)-th source line DLm+1 are short-circuited. Accordingly, a second current path IP2 is formed as shown in FIG. 6B.

A second power consumption level (Ptotal2) of the second current path IP2 may be represented as Equation 2.

$$Ptotal2 = \{P[DLm]+P[DLm+1]\}+\{P[Q3]+P[Q4]+P[Q5]\} \quad \text{[Equation 2]}$$

$$\text{wherein } P[Q3]+P[Q4]+P[Q5]=(Itotal)^2\times\frac{2RQX}{2RQ+X},\ \left(X\le\frac{2RQ}{2RQ-1}\right).$$

Itotal represents a current flowing through the second current path IP2 and is substantially the same as the current flowing through the first current path IP1. $2R_Q$ represents an internal resistance of the third and fourth switching elements Q3 and Q4, and X represents an internal resistance of the fifth switching element Q5.

Referring to Equations 1 and 2, the internal resistance of the second switch 22*b* of FIG. 6A is smaller than the internal resistance of the second switch 233*b* of FIG. 6B.

Accordingly, the power consumption level of the second switch 233*b* of FIG. 6B is smaller than the power consumption level of the second switch 33*b* of FIG. 6A, so that an amount of the current consumed through the second switch 233*b* is smaller than an amount of the current consumed through the second switch 33*b*.

An amount of the current consumed through the m-th source line DLm of FIG. 6B is larger than an amount of the current consumed through the m-th source line DLm of FIG. 6A by a difference between the amount of the current consumed through the second switch 33*b* of FIG. 6A and the amount of the current consumed through the second switch 233*b* of FIG. 6B. Accordingly, a charging rate of the pixel connected to the m-th source line DLm of FIG. 6B is larger than a charging rate of the pixel connected to the m-th source line DLm of FIG. 6A.

Figure 6C:
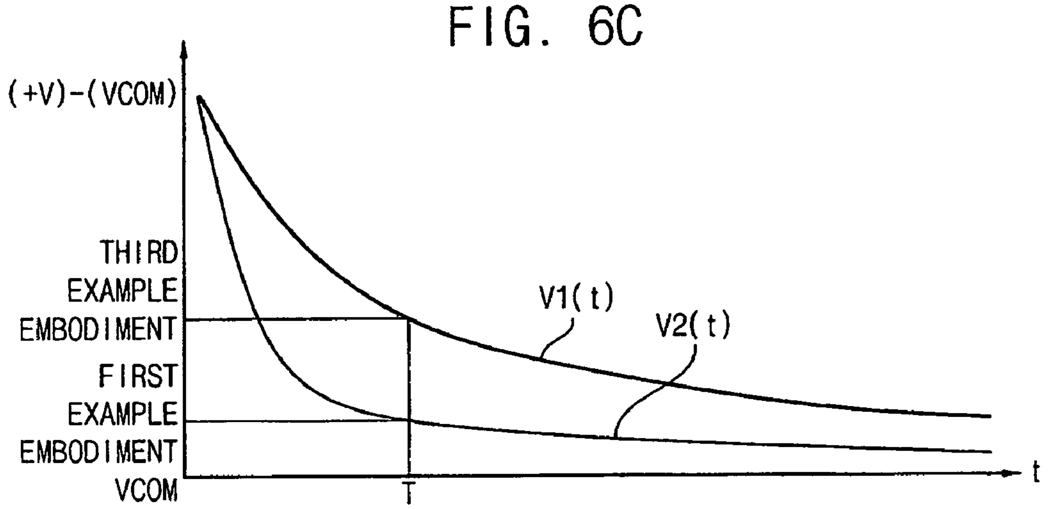
FIG. 6C is a graph illustrating variation of charge dividing voltages applied to the charge dividers according to FIGS. 6A and 6B.

FIG. 6C is a graph illustrating variation of charge dividing voltages applied to the charge dividers of FIGS. 6A-B.

Referring to FIGS. 6A, 6B and 6C, a function i1(*t*) of a current of the first current path IP1 to time and a function v1(*t*) of a voltage of the first current path IP1 to time may be represented as Equations 3 and 4, respectively.

$$i1(t)=\left\{\frac{(+V)-Vcom}{R1}\times\exp^{-1}\left(\frac{t}{R1C}\right)\right. \quad \text{[Equation 3]}$$

$$v1(t)=\{(+V)-Vcom\}\times\exp^{-1}\left(\frac{t}{R1C}\right) \quad \text{[Equation 4]}$$

wherein $C=\{(Cm)+(Cm+1)\}$, $R1=\{(Rm)+(Rm+1)+(Rcs1)\}$ and $Rcs1=2Rq$.

+V represents a voltage applied to the (m+1)-th source line DLm+1. VCOM represents a voltage applied to the second switch 33*b* when the m-th source line DLm and the (m+1)-th source line DLm+1 are short-circuited. Rm and Cm represent a resistance of the m-th source line DLm and a capacitance of the m-th source line DLm, respectively, and are constant. Rm+1 and Cm+1 represent a resistance of the (m+1)-th source line DLm+1 and a capacitance of the (m+1)-th source line DLm+1, respectively, and are constant. Rcs1 represents resistances of the third and fourth switching elements Q3 and Q4.

A function i2(*t*) of a current of the second current path IP2 to time and a function v2(*t*) of a voltage of the second current path IP2 to time may be represented as Equations 5 and 6, respectively.

$$i2(t) = \frac{(+V) - Vcom}{R2} \times \exp\left(\frac{-t}{R2C}\right) \quad \text{[Equation 5]}$$

$$v2(t) = \{(+V) - Vcom\} \times \exp\left(\frac{-t}{R2C}\right) \quad \text{[Equation 6]}$$

wherein $$R2 = \{(Rm) + (Rm+1) + (Rcs2)\}$$

and $$\frac{2RQX}{2RQ + X}, \left(X \leq \frac{2RQX}{2RQ - 1}\right).$$

+V represents a voltage applied to the (m+1)-th source line DLm+1. VCOM represents a voltage applied to the second switch 233*b* when the m-th source line DLm and the (m+1)-th source line DLm+1 are short-circuited. Rcs2 represents resistances of the third, fourth and fifth switching elements Q3, Q4 and Q5.

Referring to Equations 3 to 6, a charge dividing voltage CSV, which is a voltage applied to the first and second current paths IP1 and IP2, is variable in response to a time constant RC and time. The charge dividing voltage CSV is decreased as the time constant RC is decreased.

Since a time constant R2C of FIG. 6B is smaller than a time constant R1C of FIG. 6A, a level of the charge dividing voltage CSV of FIG. 6B is smaller than a level of the charge dividing voltage CSV of FIG. 6A. Accordingly, the level of the charge dividing voltage CSV of FIG. 6B is more similar to the common voltage VCOM than the level of the charge dividing voltage CSV of FIG. 6A.

Figure 7:
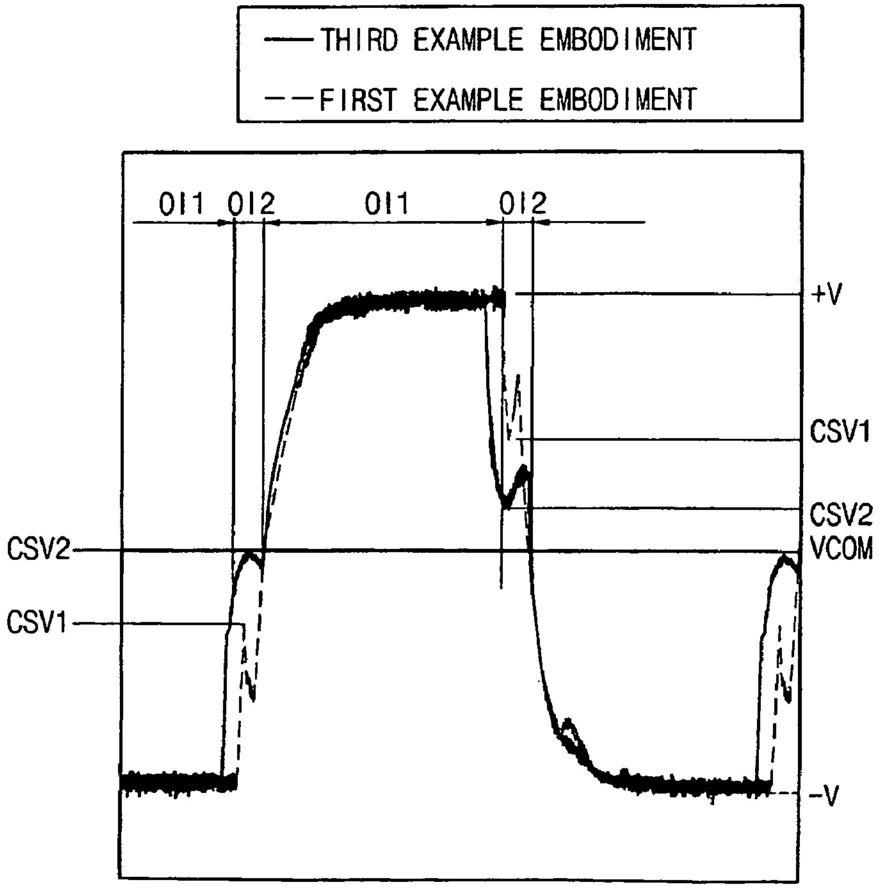
FIG. 7 is a waveform diagram illustrating data voltages outputted to a source line according to FIGS. 6A and 6B.

FIG. 7 is a waveform diagram illustrating data voltages outputted to a source line according to FIGS. 6A-B.

Referring to FIG. 7, a second charge dividing voltage CSV2 of FIG. 6B is more similar to the common voltage VCOM than a first charge dividing voltage CSV1 of FIG. 6A.

In the waveform diagram corresponding to FIG. 6A, the first charge dividing voltage CSV1 is smaller than the common voltage to generate considerable differences between the level of the first charge dividing voltage CSV1 and the level of the common voltage VCOM during a rising interval in which the data voltage rises from a negative voltage to a positive voltage.

In the waveform diagram corresponding to FIG. 6B, the second charge dividing voltage CSV2 is substantially the same as the common voltage VCOM during the rising interval.

During a falling interval in which the data voltage falls from a positive voltage to a negative voltage, the level of the second charge dividing voltage CSV2 is smaller than the level of the first charge dividing voltage CSV1, and the second charge dividing voltage CSV2 is more similar to the common voltage VCOM than the first charge dividing voltage CSV1.

When a difference between the level of the charge dividing voltage and the level of the common voltage is increased, a time during which the positive data voltage +V or the negative data voltage −V reaches the pixel is increased so that the charging rate of the pixel is decreased. When the charge dividing voltage is similar to the common voltage VCOM, the time during which the positive data voltage (+V) or the negative data voltage (−V) reaches the pixel decreases so that the charging rate of the pixel may be improved.

According to an exemplary embodiment of the present invention, a level of a charge dividing voltage is decreased so that a charge dividing voltage approximately approaches a common voltage VCOM during a rising interval and a falling interval. Therefore, the charging rate of a pixel may be improved.

According to an embodiment of the present invention, an amount of current consumed by a switch which causes a short circuit between an m-th source line and an (m+1)-th source line respectively receiving voltages having opposite phases to each other is decreased so that the charging rate of the pixel may be improved.

In detail, the switch includes a first switching element, a second switching element and a third switching element. The first switching element is connected to the m-th source line. The second switching element is connected to the first switching element in series and the (m+1)-th source line. The third switching element is connected in parallel to the first and second switching elements. A resistance of the switch is decreased by the third switching element so that an amount of current consumed by the switch is decreased. Accordingly, a charging rate of the pixel connected to the m-th and (m+1)-th source lines may be improved.

In addition, the charging rate of the pixel may be improved without increasing an output amount of a data voltage outputted to the source line.

Having described exemplary embodiments of the present invention, it is noted that various changes, substitutions and alterations can be made herein without departing from the spirit and scope of the disclosure.

What is claimed is:

1. An apparatus for driving source lines comprising:

an output buffer outputting a first voltage and a second voltage having an opposite phase to the first voltage during an output interval including a first interval portion and a second interval portion;

a first switch applying the first voltage and the second voltage to an m-th source line and an (m+1)-th source line respectively during the first interval portion and blocking the first voltage and the second voltage during the second interval portion, wherein m is a natural number; and a second switch including a plurality of switching elements, the second switch short-circuiting the m-th source line and the (m+1)-th source line during the second interval portion by at least two distinct electrical pathways between the m-th source line and the (m+1)-th source line.

2. The apparatus of claim 1, wherein the second switch outputs the first and second voltages outputted from the first switch to the m-th source line and the (m+1)-th source line, respectively, during the first interval portion.

3. The apparatus of claim 1, further comprising a clock generator generating a first clock signal and a second clock signal, wherein the first clock signal turns on the first switch during the first interval portion and turns off the first switch during the second interval portion, and the second clock signal turns off the second switch during the first interval portion and turns on the second switch during the second interval portion.

4. The apparatus of claim 3, wherein the plurality of switching elements comprises:

a first switching element including a first control electrode receiving the second clock signal, a first current electrode connected to the m-th source line and a second current electrode connected to a bias line;

a second switching element including a second control electrode receiving the second clock signal, a third current electrode connected to the (m+1)-th source line and a fourth current electrode connected to the bias line; and a third switching element comprises a third control electrode receiving the second clock signal, a fifth current electrode connected to the m-th source line and a sixth current electrode connected to the (m+1)-th source line.

5. The apparatus of claim 4, wherein the first switch comprises:

a fourth switching element connected to an m-th output terminal of the output buffer; and a fifth switching element connected to the fourth switching element and an (m+1)-th output terminal of the output buffer.

6. The apparatus of claim 5, wherein the fourth switching element comprises a fourth control electrode receiving the first clock signal, a seventh current electrode connected to the m-th output terminal and an eighth current electrode connected to the m-th source line, and the fifth switching element comprises a fifth control electrode receiving the first clock signal, a ninth current electrode connected to the (m+1)-th output terminal and a tenth current electrode connected to the (m+1)-th source line.

7. The apparatus of claim 1, wherein the output interval is a horizontal interval.

8. A display apparatus comprising:

a display panel including a plurality of gate lines, a plurality of source lines and a plurality of pixels connected to the gate lines and the source lines; and an apparatus for driving source lines including:

an output buffer outputting a first voltage and a second voltage having an opposite phase to the first voltage during an output interval having a first interval portion and a second interval portion;

a first switch applying the first voltage and the second voltage to an m-th source line and an (m+1)-th source line respectively during the first interval portion and blocking the first voltage and the second voltage during the second interval portion, wherein m is a natural number; and a second switch including a plurality of switching elements, the second switch short-circuiting the m-th source line and the (m+1)-th source line during the second interval portion by at least two distinct electrical pathways between the m-th source line and the (m+1)-th source line.

9. The display apparatus of claim 8, wherein the second switch outputs the first and second voltages applied from the first switch to the m-th source line and the (m+1)-th source line, respectively.

10. The display apparatus of claim 8, wherein the output buffer further comprises a timing controller providing the output buffer with an enable signal controlling the output interval.

11. The display apparatus of claim 10, wherein the apparatus for driving source lines further comprises a clock generator generating a first clock signal and a second clock signal in response to the enable signal, wherein the first clock signal turns on the first switch during the first interval portion and turns off the first switch during the second interval portion, and the second clock signal turns off the second switch during the first interval portion and turns on the second switch during the second interval portion.

12. The display apparatus of claim 11, wherein the first and second voltages are applied to the m-th source line and the (m+1)-th source line, respectively, during the first interval portion, and a charge dividing voltage corresponding to the first and second voltages is applied to the m-th source line and the (m+1)-th source line during the second interval portion.

13. The display apparatus of claim 12, wherein the plurality of switching elements of the second switch comprises:

a first switching element comprises a first control electrode receiving the second clock signal, a first current electrode connected to the m-th source line and a second current electrode connected to a bias line;

a second switching element comprises a second control electrode receiving the second clock signal, a third current electrode connected to the (m+1)-th source line and a fourth current electrode connected to the bias line; and a third switching element comprises a third control electrode receiving the second clock signal, a fifth electrode connected to m-th source line and a sixth current electrode connected to the (m+1)-th source line.

14. The display apparatus of claim 13, wherein the first switch comprises:

a fourth switching element connected to an m-th output terminal of the output buffer; and a fifth switching element connected to the fourth switching element in series and an (m+1)-th output terminal of the output buffer.

15. The display apparatus of claim 14, wherein the fourth switching element comprises a fourth control electrode receiving the first clock signal, a seventh current electrode connected to the m-th output terminal and an eighth current electrode connected to the m-th source line, and the fifth switching element comprises a fifth control electrode receiving the first clock signal, a ninth current electrode connected to the (m+1)-th output terminal and a tenth current electrode connected to the (m+1)-th source line.

16. The display apparatus of claim 13, wherein the display panel comprises a display area including the pixels and a peripheral area surrounding the display area, and the third switching element is disposed in the peripheral area.

17. The display apparatus of claim 8, wherein the apparatus for driving source lines further comprises:

a line latch that latches data signals; and a digital-to-analog converter converting the data signals outputted from the line latch into the first voltage and the second voltage, the first and second voltages provided to the output buffer.

18. The display apparatus of claim 8, further comprising an apparatus for driving gate lines outputting gate signals to the gate lines.

19. The apparatus of claim 4, wherein a first electrical pathway between the m-th source line and the (m+1)-th source line comprises the first switching element and the second switching element and a second electrical pathway between the m-th source line and the (m+1)-th source line comprises the third switching element.

20. The display apparatus of claim 13, wherein a first electrical pathway between the m-th source line and the (m+1)-th source line comprises the first switching element and the second switching element and a second electrical pathway between the m-th source line and the (m+1)-th source line comprises the third switching element.

* * * * *